United States Patent
Wang et al.

(10) Patent No.: US 6,922,231 B1
(45) Date of Patent: Jul. 26, 2005

(54) RECEIVER OPTICAL SUB-ASSEMBLY WITH DIAGNOSTIC SIGNAL

(75) Inventors: Xiangzhong Wang, Fremont, CA (US); Robert P. Hartzell, Emerald Hills, CA (US)

(73) Assignee: Opnext, Inc., Fremont, CA (US)

( * ) Notice: Subject to any disclaimer, the term of this patent is extended or adjusted under 35 U.S.C. 154(b) by 289 days.

(21) Appl. No.: 10/350,494

(22) Filed: Jan. 23, 2003

(51) Int. Cl.[7] .............................................. G01N 21/00
(52) U.S. Cl. ...................................................... 356/73.1
(58) Field of Search ................ 356/73.1; 332/106–112; 385/14, 88, 92, 94

(56) References Cited

U.S. PATENT DOCUMENTS

| | | | | |
|---|---|---|---|---|
| 5,023,947 A | * | 6/1991 | Cimini et al. | 398/202 |
| 6,069,686 A | * | 5/2000 | Wang et al. | 356/35.5 |
| 6,639,482 B2 | * | 10/2003 | Geiger et al. | 332/106 |

* cited by examiner

*Primary Examiner*—Tu T. Nguyen
(74) *Attorney, Agent, or Firm*—Finnegan, Henderson, Farabow, Garrett & Dunner LLP

(57) ABSTRACT

A fiber-optic receiver apparatus is described, which monitors and outputs the average received optical power of the incoming optical data beam, as well as the differential amplitude signal.

26 Claims, 2 Drawing Sheets

RECEIVER OPTICAL SUB-ASSEMBLY WITH DIAGNOSTIC SIGNAL

FIELD OF THE INVENTION

The present invention relates to fiber optic receivers and, in particular, a fiber optic receiver with a diagnostic signal.

BACKGROUND OF THE INVENTION

In order to realize high speed voice and data communication, optical transmission pathways have been designed and built that encode data in a modulated light signal and transmit the light signal with an optical waveguide, such as a glass or plastic fiber. The data is encoded and transmitted by a transceiver optical sub-assembly (TOSA) operating with an encoder, and received and decoded by a receiver optical sub-assembly (ROSA) operating with a decoder. Typically included in the TOSA is a diode laser, lens, and a circuit for driving the laser. Typically included in the ROSA is a lens, photodetector and amplifier for amplifying the photocurrent signal produced by the photodetector.

The form factor for a ROSA is generally a TO-46 can package, which is a 4-pin output package designed to mate with a fiber optic cable and corresponding LC connector. The four pins are usually dedicated to the positive polarity data, the inverse polarity data, the supply voltage, and ground.

The positive polarity data and inverse polarity data pins can be AC coupled to a data detector, which measures the optical modulated amplitude (OMA). The optical modulated amplitude, along with the extinction coefficient and the average power, define the attributes of the laser beam which comprises the data signal. The amplitude of the signal modulation may be measured by a radio frequency (rf) amplifier, and correlated to a root-mean-square (rms) value for the amplitude of the optical (AC) modulation. Such rf measurements can be sufficiently accurate indicators of the average detected optical power for relatively high power signals, however their accuracy is poor for lower input power levels. This is because the OMA measurement is a non-linear method, using an rf power amplifier which amplifies the noise power as well as the signal power. When the power level is low, it is difficult to separate the noise power from the signal power. Therefore it is difficult to detect a fault situation, such as a broken or intermittent link occurring on an optical transmission line, using optical modulation amplitude alone, because the noise contributes substantially to the overall signal level. Therefore techniques which measure the (AC) modulation amplitude are relatively poor indicators of changes in the attenuation of the data transmission channel.

Therefore, it is desirable to measure a DC average power level rather than the modulated amplitude (AC component) of the optical signal, and to output that signal to diagnostic circuitry.

SUMMARY

In accordance with an embodiment of the present invention, a receiver optical sub-assembly (ROSA) for receiving an optical data signal from a fiber optic input line is presented. The sub-assembly includes an electro-optic transducer, configured to produce an electrical data signal in response to a received optical data signal. The transducer includes a cathode and anode. The cathode of the transducer can be coupled to a diagnostic signal pin, for outputting a diagnostic signal indicative of the average received optical power in the optical data signal. The receiver optical sub-assembly further includes an amplifier with an input coupled to the anode of the electro-optic transducer, and operable to amplify electrical data signals produced by the electro-optic transducer, the amplifier having an inverted polarity data output pad coupled to an inverted polarity data output pin, and a non-inverted polarity data output pad coupled to a non-inverted polarity data output pin.

The ROSA according to the present invention therefore has an additional diagnostic pin added to the conventional four-pin connector, in which the four usual pins carry supply voltage, ground, inverted polarity output data, and non-inverted polarity output data. The fifth pin carries the diagnostic signal, which is related to the average received power, and therefore has a DC signal level in addition to the usual optical modulation amplitude. The modulation amplitude corresponds to the data pattern, whereas the average received power corresponds to the input power and attenuation from the data channel. Monitoring the average received power allows the user to monitor the condition of the data channel, and to detect anomalous increases in the attenuation, as would result, for example, from damaged or faulty links in the data channel.

Because the average power measurement is a linear method, very good accuracy can be obtained, and calibration of the signal is straightforward. Even at low signal levels, the signal may be separated from the noise using simple signal processing algorithms, such as averaging. The average power is a direct indication of signal strength or link attenuation.

The receiver optical sub-assembly with diagnostic signal may be included in a larger system for monitoring the performance of a data channel in terms of its attenuation. In this embodiment, the diagnostic signal indicative of the average optical power of the incoming transmitted data signal is a current generated by the electro-optic transducer. This current is applied to an external resistor, and the voltage drop across the resistor is amplified by an amplifier. The amplified value may then be digitized by an analog-to-digital converter, and output to a monitoring computer. The value detected by the computer may then be compared to a reference value, and a warning flag asserted if the level drops below the reference value. In this embodiment, the receiver optical sub-assembly with diagnostic signal can be used to provide early warning of faults occurring in the data transmission channel, as anomalous changes in the attenuation of the channel.

These and other features and advantages of the present invention will be described in more detail below with reference to the associated figures.

DETAILED DESCRIPTION

In accordance with embodiments of the present invention, a fiber optic receiver apparatus, in which an additional pin is provided to output the average detected power level of the input power of the optical data signal is presented. The additional pin is connected to an electrode of the electro-optical transducer, which is the photodetector used to measure the incoming light levels. This additional pin will provide the diagnostic signal to external detection circuitry, indicative of the average optical power received by the photodetector. Therefore, while the anode of the photodetector is conventionally coupled to a trans-impedance amplifier (TIA) input pad, the cathode of the detector is coupled to the additional pin provided for its output. This pin output may then be digitized and monitored by an external computer to detect faults occurring in the transmission path, which results in an anomalous reduction of the average transmitted optical power.

Figure 1:
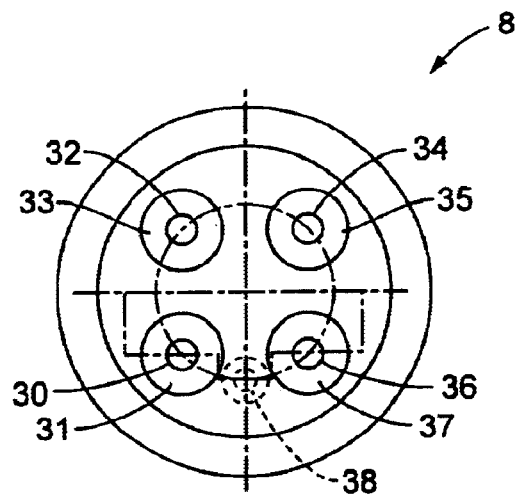
FIG. 1 is a mechanical drawing of the header of the 5-pin ROSA, according to an embodiment of the present invention.

FIG. 1 is a mechanical drawing of a TO-46 connector 8 with 5 pins, according to an embodiment of this invention. One skilled in the art will recognize that the TO-46 style connector is only an example, and that other form factor connectors may be used to house a receiving apparatus according to the present invention. In this embodiment, the 5-pin ROSA 8 has 4 insulated pins 30, 32, 34, and 36 which protrude through a metallic header 42, and a ground pin 38 which is in electrical contact with the header. The insulation may be a layer of glass, which isolates the metallic pins from the metallic header. The header 42 is the surface which supports other components of the receiving apparatus, including an amplifier 10, two single layer ceramic (SLC) capacitors 12 and 14, and a photodetector 16 (see FIG. 2). The SLC capacitors are metallized on the two opposing surfaces, for connection with the other components of the circuit.

FIG. 1 shows that whereas the other four pins 30, 32, 34, and 36 are insulated from the metallic header by insulation layers 31, 33, 35 and 37, pin 38 is in direct electrical contact with the metal alloy of header 42. The electrical connection may be made by brazing the metallic surface of pin 38 to the metallic surface of header 42. The diameter of the insulating layers 31, 33, 35, and 37 may be, for example, 1.2 mm, around a central pin bore 30, 32, 34, and 36 of 0.4 mm, as indicated in FIG. 1. The pins 30, 32, 34, and 36 extend through header 42 and to an elevation of 0.3 mm above header 42 to provide an area for wire bonding to the pins.

Figure 2:
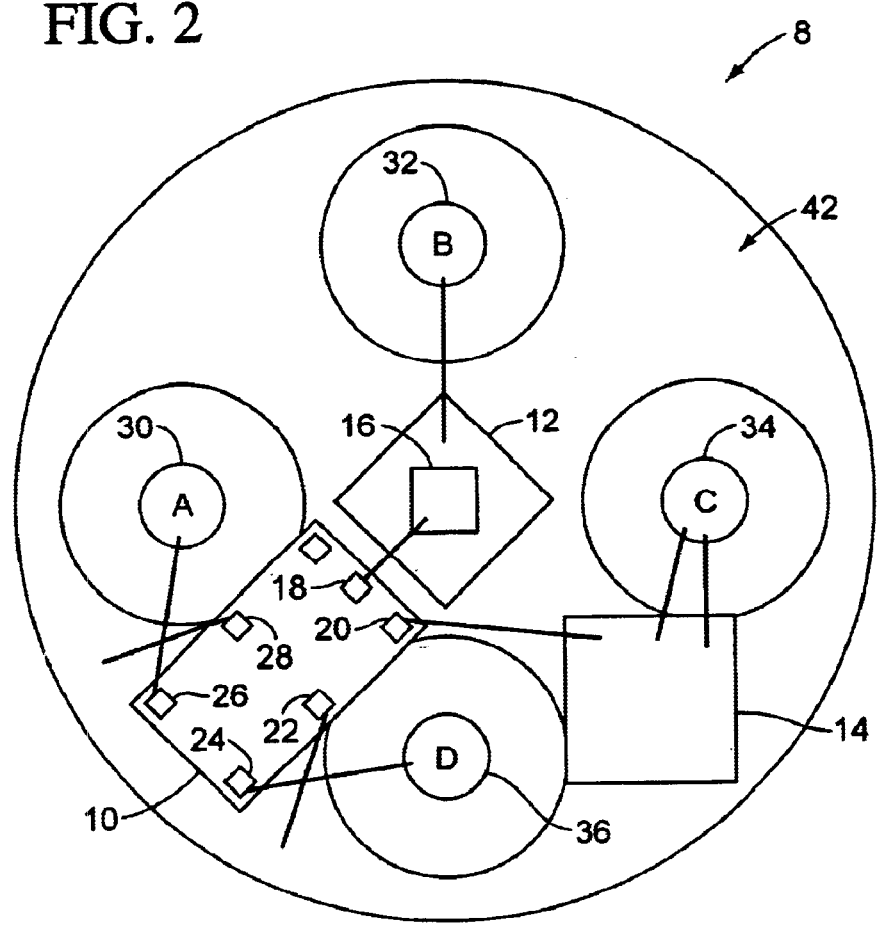
FIG. 2 is a wirebond diagram of the circuit connections of the 5-pin ROSA according to an embodiment of the present invention.

FIG. 2 is a wirebond diagram showing the wirebond connections for a circuit embodiment of the present invention. As shown in the wirebond diagram of FIG. 2, the ROSA 8 includes an electro-optic transducer, or photodetector 16, and an amplifier 10 which amplifies the signal produced by the photodetector 16 in response to illumination by the incoming laser light. Only the four insulated pins 30, 32, 34, and 36 are shown in FIG. 2, because the ground pin 38 is obscured by the body of the amplifier 10, which lies directly overtop of pin 38 in this embodiment.

The photodetector 16 may be a P-type, Intrinsic, N-type (P-I-N) photodetector, for example an InGaAs PIN detector. The detector 16 is mounted electrically, by solder or conductive epoxy, to the top electrode of one of the SLC capacitors 12. The other electrode of the SLC capacitor is connected electrically to the metallic header 42 lying beneath it. The center of the photodetector is located in the approximate center of the header, to intercept the focused rays coming from the input fiber line (not shown), through a lens mounted in the ferrule of the input LC connector (not shown), or in the ROSA 8.

The amplifier 10 in this embodiment is a trans-impedance amplifier (TIA), for example the MAX3864 available from Maxim Integrated Products of Sunnyvale, Calif. The trans-impedance amplifier converts current signals input from the light receiving photodetector 16 to voltage signals. The TIA may be a bare die, with contact pads 18, 20, 22, 24, 26, and 28. The contact pads are metallized areas on the chip to which a gold ball bond may be made. Pad 18 is the input pad, and is coupled to the anode of the photodetector 16 by a gold ball bonded wire. The cathode of the photodetector is soldered or bonded with conductive epoxy to one electrode of SLC capacitor 12. The other electrode of the SLC capacitor 12 is bonded to the header 42, and thereby to the case ground.

Power is provided to the amplifier 10 by the power supply pin 34, which is one of the four insulated pins in the 5-pin ROSA 8. The supply voltage is delivered by post 34 of the ROSA 8, to the TIA via contact pad 20, across the electrode of the second SLC capacitor 14. The other electrode of capacitor 14 is solder bonded or attached with conductive epoxy to the case ground and header surface 42.

Bias voltage is supplied to the photodetector by pin 32, which will also carry the average photocurrent signal to circuitry external to the ROSA. The bias voltage is delivered by coupling pin 32 across the electrode of SLC capacitor 12, which is then coupled to the cathode of the photodetector 16. Each of these connections may be made, for example, by gold ball bonding of a wire between the pad and pin.

The other wirebonds are as shown in FIG. 2. The TIA outputs a differential signal corresponding to the optical modulation amplitude of the signal generated by the photodetector. Post 30 is coupled to the inverse polarity data output line 26 of the TIA, and post 36 is coupled to the non-inverted polarity of the data output line 24 of the TIA. Ground pads 22 and 28 of the TIA are coupled to the header surface 42, and thereby to the case ground.

Figure 3:
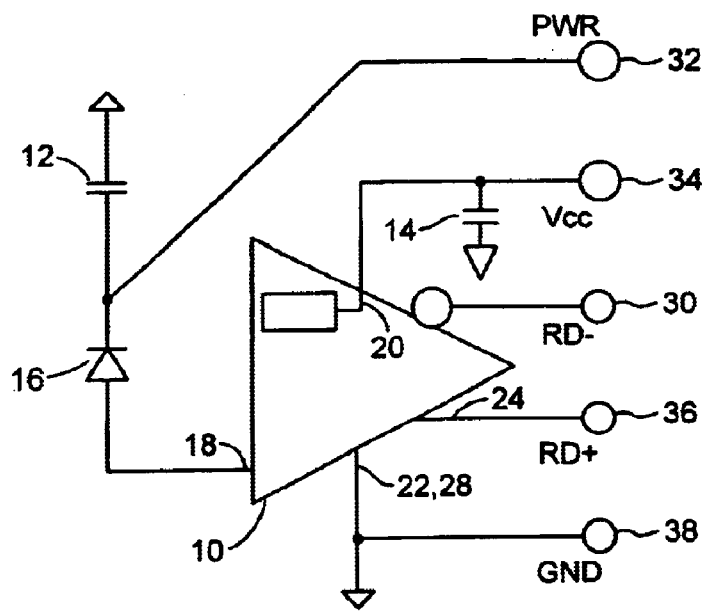
FIG. 3 is a simplified schematic diagram of the 5-pin ROSA embodiment of FIG. 2.

FIG. 3 is a simplified schematic diagram corresponding to the wirebond diagram of FIG. 2. The schematic shows the anode of photodetector 16, coupled to the input pad 18 of the TIA amplifier 10. The cathode of the photodetector 16 is coupled to SLC capacitor 12 and to pin 32 of the ROSA, to provide the average power signal for external diagnostic circuitry. The other electrode of SLC capacitor 12 is connected to ground via the header surface 42. The TIA converts the electrical signals generated by the photodetector 16 in response to the modulated intensity waveform of the incident light beam, into an amplified voltage signal which is differentially output on pins 30 and 36 of the ROSA. The ground pins 22 and 28 of the TIA are coupled to the case ground, which is further coupled to the ground pin 38 of the 5-pin ROSA 8.

The ground side of capacitors 12 and 14 are coupled to the case ground by direct connection to the header surface 42. The values of the capacitors, may be for example 1000 pf. It is clear from the schematic circuit diagram of FIG. 3, that the pin 32 of the ROSA serves two purposes: to deliver the DC bias voltage to the photodetector 16, and to carry the average photocurrent signal produced by the laser light impinging on photodetector 16.

Figure 4:
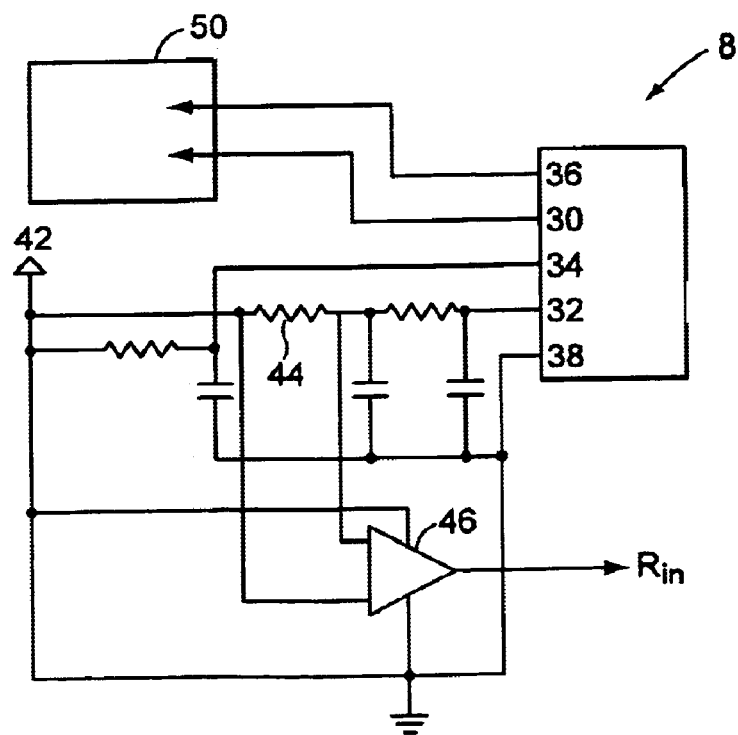
FIG. 4 is a schematic of a typical application of the present invention.

FIG. 4 shows an exemplary application using the present invention. In this application, data outputs from the TIA 10 are routed to a data detector 50 as Rd+ (non-inverted data output) on pin 36 and Rd– (inverted data output) on pin 30 of ROSA 8. The signal output on pin 32 corresponds to the average detected power of the incoming data signal, as measured by the PIN photodetector 16. Pin 32 also carries the bias voltage from voltage supply source 42. The current generated on pin 32 in connection with the cathode of the photodetector 16, is applied to an external sense resistor 44 and the voltage difference is measured across the resistor 44. The resistance value of the external sense resistor may be, for example, 200 Ω. The signal measured across resistor 44 is amplified by a current-sensing amplifier 46, for example the MAX4372TEUK, also available from Maxim Integrated Products of Sunnyvale, Calif. The current-sensing amplifier 46 amplifies the signal to generate $R_{in}$, which may then be digitized by an analog-to-digital converter (ADC, not shown), and the value is input to a computer (not shown). The computer can then compare the measured value to a reference value, and assert a warning flag if the measured level drops below the reference level.

Because the signal on pin 32 of the ROSA corresponds to the average detected photocurrent, it can provide diagnostic information to the computer as to the status of the transmission line delivering the optical data signal. For example if an optical link is damaged or intermittent, this condition is readily detected by an anomalous drop in the average power detected in the optical signal. Other detection means which measure only AC coupled signals, cannot detect a change in the average signal level, and are therefore relatively insensitive to changes in the condition of the transmission channel, such as degraded links. In this situation, no warning of imminent failure may be available, until the data channel fails. Using the average transmitted intensity, early warning of transmission channel degradation is possible, by detecting anomalous changes in the average transmitted intensity of the input light beam.

The 5-pin ROSA described herein is designed, for example, to mate with a conventional optical fiber delivered by, e.g., an LC connector. The LC connector may mate to the outer surface of the TO-46 package, and center the input fiber on the aperture of the photodetector. The ROSA may also include a lens for focusing the light rays onto the photodetector. It will be clear, however, to those skilled in the art, that the embodiments described herein, including the TO-46 and LC connectors are illustrative only and not limiting. The invention can be applied to any of a number of different styles of cables and connectors, without departing from the spirit and scope of this invention.

Therefore, this invention is not limited to the embodiments described above. For instance, the invention is not limited to the particular style of connector, such as the TO-46, or the particular components included in the receiver optical sub-assembly, such as the MAX3864. Likewise, the invention is not limited to a particular transmission wavelength or other optical standards. Other embodiments and variations within the scope of the invention, as defined by the appended claims, will occur to practitioners in view of the disclosure herein.

What is claimed is:

1. A receiver optical sub-assembly for receiving an optical data signal, the sub-assembly comprising:
    an electro-optic transducer, configured to produce an electrical data signal in response to a received optical data signal, the transducer having two electrodes, one of said electrodes being coupled to a diagnostic pin for outputting a diagnostic signal; and
    an amplifier with an input coupled to the other electrode of said electro-optic transducer, and operable to amplify electrical data signals produced by said electro-optic transducer.

2. The sub-assembly of claim 1, wherein the diagnostic signal is indicative of an average power in the optical data signal.

3. The sub-assembly of claim 1, wherein the amplifier has an inverted polarity data output pad coupled to an inverted polarity data output pin, and a non-inverted polarity data output pad coupled to a non-inverted polarity data output pin.

4. The sub-assembly of claim 3, wherein a cathode of the electro-optic transducer is coupled to the diagnostic pin, and an anode of the electro-optic transducer is coupled to the input of the amplifier.

5. The subassembly of claim 4, further comprising a voltage supply pin coupled to an amplifier voltage input pad of the amplifier.

6. The subassembly of claim 5, further comprising a ground pin coupled to an exterior surface of the sub-assembly.

7. The sub-assembly of claim 6, further comprising a metallic header, through which the diagnostic pin, the voltage supply pin, the inverted polarity data output pin, and the non-inverted polarity data output pins protrude, wherein the header is coupled to the ground pin of the package.

8. The sub-assembly of claim 7, further comprising a capacitor coupled between the voltage supply pin and the header.

9. The sub-assembly of claim 7, further comprising a capacitor coupled between the cathode of the electro-optic transducer and the header.

10. The subassembly of claim 1, wherein the amplifier is a trans-impedance amplifier.

11. The sub-assembly of claim 1, further comprising a lens for focusing the optical data signal onto the electro-optic transducer.

12. The sub-assembly of claim 1, wherein the diagnostic pin also carries a bias voltage for the electro-optic transducer.

13. A system for monitoring a condition of an optical data transmission channel, the system comprising:
    a receiver optical sub-assembly for detecting the optically transmitted data, the receiver optical sub-assembly further comprising:
        an electro-optic transducer which generates a modulated amplitude electrical signal in response to a received optical signal, and generates a current indicative of the average power of the received optical signal;
        an amplifier which amplifies the modulated amplitude electrical signal generated by the electro-optic transducer, and outputs a differential output signal proportional to the modulation amplitude of the signal generated by the electro-optic transducer;
    a first circuit which outputs a diagnostic signal proportional to the current indicative of the average power of the received optical signal; and
    a second circuit configured to monitor the diagnostic signal output by the first circuit, and compare the output to a reference level, in order to determine the condition of the optical data transmission channel.

14. The system of claim 13, wherein the first circuit further comprises:
    a resistor across which the current indicative of the average power is applied; and
    a second amplifier which amplifies a voltage measured across the resistor.

15. The system of claim 14, further comprising an analog-to-digital converter to digitize a signal output by the second amplifier, and provide said digitized signal to the second circuit.

16. A method for monitoring a condition of an optical transmission channel, the method comprising:

coupling an electrode of an electro-optic transducer to a diagnostic pin, to produce a signal indicative of the average power in an optically transmitted data pattern; and monitoring the diagnostic pin to detect when the average power falls beneath a reference level.

17. The method of claim 16, wherein the electrode coupled to the diagnostic pin is the cathode of the electro-optic transducer.

18. The method of claim 17, further comprising coupling an anode of the electro-optic transducer to the input of an amplifier.

19. The method of claim 18, wherein the amplifier is a trans-impedance amplifier.

20. The method of claim 18, further comprising coupling a voltage source input of the amplifier to a voltage source.

21. The method of claim 16, further comprising coupling a voltage source to the diagnostic pin.

22. The method of claim 21, further comprising coupling a capacitor between the voltage source and ground.

23. The method of claim 16, further comprising coupling a capacitor between the diagnostic pin and ground.

24. The method of claim 16, further comprising asserting a warning flag when the average power drops below the reference level, indicating a fault in the optical transmission channel.

25. The method of claim 16, wherein monitoring the diagnostic pin comprises applying a signal from the diagnostic pin to a resistor, and measuring a voltage drop across the resistor.

26. The method of claim 16, further comprising digitizing the signal from the diagnostic pin, and monitoring the digitized signal with a computer.

* * * * *